United States Patent
Hawrylchak et al.

(10) Patent No.: US 11,990,321 B2
(45) Date of Patent: *May 21, 2024

(54) FAST RESPONSE PEDESTAL ASSEMBLY FOR SELECTIVE PRECLEAN

(71) Applicant: Applied Materials, Inc., Santa Clara, CA (US)

(72) Inventors: Lara Hawrylchak, Gilroy, CA (US); Chaitanya A. Prasad, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/992,995

(22) Filed: Nov. 23, 2022

(65) Prior Publication Data

US 2023/0086640 A1 Mar. 23, 2023

Related U.S. Application Data

(63) Continuation of application No. 15/934,415, filed on Mar. 23, 2018, now Pat. No. 11,515,130.

(Continued)

(51) Int. Cl.
*H01J 37/32* (2006.01)
*B08B 7/00* (2006.01)
(Continued)

(52) U.S. Cl.
CPC .......... *H01J 37/32724* (2013.01); *B08B 7/00* (2013.01); *H01J 37/3244* (2013.01);
(Continued)

(58) Field of Classification Search
CPC ............. H01J 37/32724; H01J 37/3244; H01J 2237/334; H01J 2237/335; B08B 7/00;
(Continued)

(56) References Cited

U.S. PATENT DOCUMENTS 5,886,863 A * 3/1999 Nagasaki ............... H02N 13/00
279/128
6,106,630 A * 8/2000 Frankel ............... C23C 16/4581
427/454

(Continued)

FOREIGN PATENT DOCUMENTS

JP    H05335200 A    12/1993
JP    2002514010 A    5/2002
(Continued)

OTHER PUBLICATIONS

International Search Report and Written Opinion for PCT/US2018/014759 dated May 14, 2019.

(Continued)

*Primary Examiner* — Charlee J. C. Bennett
(74) *Attorney, Agent, or Firm* — Patterson + Sheridan, LLP

(57) ABSTRACT

Implementations of the present disclosure generally relate to an improved substrate support pedestal assembly. In one implementation, the substrate support pedestal assembly includes a shaft. The substrate support pedestal assembly further includes a substrate support pedestal, mechanically coupled to the shaft. The substrate support pedestal comprises substrate support plate coated on a top surface with a ceramic material.

20 Claims, 4 Drawing Sheets

Related U.S. Application Data

(60) Provisional application No. 62/638,716, filed on Mar. 5, 2018.

(51) Int. Cl.
  *H01L 21/02* (2006.01)
  *H01L 21/67* (2006.01)
  *H01L 21/687* (2006.01)

(52) U.S. Cl.
  CPC .. *H01L 21/02046* (2013.01); *H01L 21/67028* (2013.01); *H01L 21/67069* (2013.01); *H01L 21/67103* (2013.01); *H01L 21/67109* (2013.01); *H01L 21/68757* (2013.01); *H01L 21/68792* (2013.01); *H01J 2237/002* (2013.01); *H01J 2237/334* (2013.01); *H01J 2237/335* (2013.01)

(58) Field of Classification Search
  CPC ......... H01L 21/67028; H01L 21/67069; H01L 21/67103; H01L 21/67109; H01L 21/68757; H01L 21/68792; H01L 21/6838
  See application file for complete search history.

(56) References Cited

U.S. PATENT DOCUMENTS

| | | | |
|---|---|---|---|
| 7,767,024 B2 | 8/2010 | Kao et al. | |
| 2002/0083897 A1* | 7/2002 | Shang | C23C 16/46 118/728 |
| 2002/0129475 A1 | 9/2002 | Tsai et al. | |
| 2002/0162507 A1* | 11/2002 | Shang | H01J 37/32477 118/723 R |
| 2003/0160568 A1* | 8/2003 | Arai | H01L 21/6833 315/111.21 |
| 2006/0144516 A1 | 7/2006 | Ricci et al. | |
| 2007/0258186 A1* | 11/2007 | Matyushkin | H01L 21/6875 361/234 |
| 2008/0268645 A1* | 10/2008 | Kao | H01L 21/67069 438/694 |
| 2009/0002913 A1* | 1/2009 | Naim | H01L 21/67109 279/128 |
| 2009/0283217 A1* | 11/2009 | Lubomirsky | H01L 21/6838 156/345.34 |
| 2013/0037532 A1* | 2/2013 | Volfovski | H05B 3/265 219/385 |
| 2014/0050713 A1 | 2/2014 | Appaiah et al. | |
| 2015/0380220 A1* | 12/2015 | Tan | H01J 37/32715 219/443.1 |
| 2017/0098566 A1* | 4/2017 | Long | H01L 21/6833 |
| 2017/0204514 A1 | 7/2017 | Kim et al. | |
| 2017/0221734 A1 | 8/2017 | Lindley | |

FOREIGN PATENT DOCUMENTS

| | | |
|---|---|---|
| JP | 2008306212 A | 12/2008 |
| KR | 20140050713 A | 4/2014 |
| TW | 200721355 A | 6/2007 |

OTHER PUBLICATIONS

Korean Office Action for Application No. 10-2020-7028456 dated Feb. 4, 2022.
Taiwan Office Action for Application No. 108104561 dated May 4, 2022.
Office Action from Taiwan Patent Application No. 108104561 dated Aug. 15, 2022.
Korean Office Action for Application No. 10-2020-7028456 dated Aug. 24, 2022.
Final Office Action for U.S. Appl. No. 15/934,415 dated Feb. 15, 2022.
Office Action for U.S. Appl. No. 15/934,415 dated Oct. 8, 2021.
Final Office Action for U.S. Appl. No. 15/934,415 dated Apr. 21, 2021.
Office Action for U.S. Appl. No. 15/934,415 dated Apr. 15, 2020.
Office Action for U.S. Appl. No. 15/934,415 dated Dec. 12, 2019.
Notice of Allowance for U.S. Appl. No. 15/934,415 dated Sep. 26, 2022.
Notice of Allowance for U.S. Appl. No. 15/934,415 dated Sep. 8, 2022.
Notice of Allowance for U.S. Appl. No. 15/934,415 dated Aug. 9, 2022.
Notice of Allowance for U.S. Appl. No. 15/934,415 dated Jul. 27, 2022.
Taiwan Office Action for Application No. 108104561 dated Nov. 8, 2023.

* cited by examiner ations.
FAST RESPONSE PEDESTAL ASSEMBLY FOR SELECTIVE PRECLEAN

CROSS-REFERENCE TO RELATED APPLICATIONS

This application is a continuation of U.S. patent application Ser. No. 15/934,415, filed Mar. 23, 2018, which claims benefit of U.S. Provisional Patent Application No. 62/638,716, filed Mar. 5, 2018, each of which is incorporated herein by reference in its entirety.

FIELD

Implementations of the present disclosure generally relate to a pedestal for use in precleaning chamber and a method for cleaning a surface of a substrate.

BACKGROUND

Integrated circuits are formed in and on silicon and other semiconductor substrates. In the case of single crystal silicon, substrates are made by growing an ingot from a bath of molten silicon, and then sawing the solidified ingot into multiple substrates. An epitaxial silicon layer may then be formed on the monocrystalline silicon substrate to form a defect free silicon layer that may be doped or undoped. Semiconductor devices, such as transistors, may be manufactured from the epitaxial silicon layer. The electrical properties of the formed epitaxial silicon layer are generally better than the properties of the monocrystalline silicon substrate.

Surfaces of the monocrystalline silicon and the epitaxial silicon layer are susceptible to contamination when exposed to typical substrate fabrication facility ambient conditions. For example, a native oxide layer may form on the monocrystalline silicon surface prior to deposition of the epitaxial layer due to handling of the substrates and/or exposure to ambient environment in the substrate processing facility. Additionally, foreign contaminants such as carbon and oxygen species present in the ambient environment may deposit on the monocrystalline surface. The presence of a native oxide layer or contaminants on the monocrystalline silicon surface negatively affects the quality of an epitaxial layer subsequently formed on the monocrystalline surface. It is therefore desirable to pre-clean the substrates in order to remove the surface oxidation and other contaminants before epitaxial layers are grown on the substrates.

Conventional pre-clean processes are often carried out in a standalone vacuum process chamber having a substrate support pedestal. The top plate of the pedestal on which the substrate is supported is fabricated from ceramic to prevent metal contamination resulting from substrate contact with metal surfaces. Because the ceramic plate is a poor conductor of heat, temperature control of the top surface of the pedestal in contact with the substrate is difficult, and the time required to stabilize the temperature of the substrate can be prohibitively long, which may undesirably increase substrate processing time and the cost to process the substrate. In addition, some processes will cycle the substrate temperature between two or more temperatures, and the impact of this stabilization time may be repeated multiple times.

Therefore, there is a need in the art to for an improved substrate support pedestal for use in a precleaning chamber.

SUMMARY

An improved substrate support pedestal assembly is described herein. In one implementation, the substrate support pedestal assembly includes a shaft and a substrate support pedestal coupled to the shaft. The substrate support pedestal includes an aluminum substrate support plate having a top surface coated with a ceramic material. The substrate support pedestal assembly may also include backside gas channels, which can be used to further improve coupling between a top surface of the substrate support pedestal and a substrate.

An improved processing chamber is described herein. In one implementation, the processing chamber includes a chamber body and a pedestal assembly at least partially disposed within the chamber body. The pedestal assembly includes a substrate support pedestal to support a substrate thereon during processing. The substrate support pedestal includes a shaft and an aluminum substrate support plate mechanically coupled to the shaft and having a top surface coated with a ceramic material.

BRIEF DESCRIPTION OF THE DRAWINGS

Implementations of the present disclosure, briefly summarized above and discussed in greater detail below, can be understood by reference to the illustrative implementations of the disclosure depicted in the appended drawings. It is to be noted, however, that the appended drawings illustrate only typical implementations of this disclosure and are therefore not to be considered limiting of its scope, for the disclosure may admit to other equally effective implementations.

Figure 1:
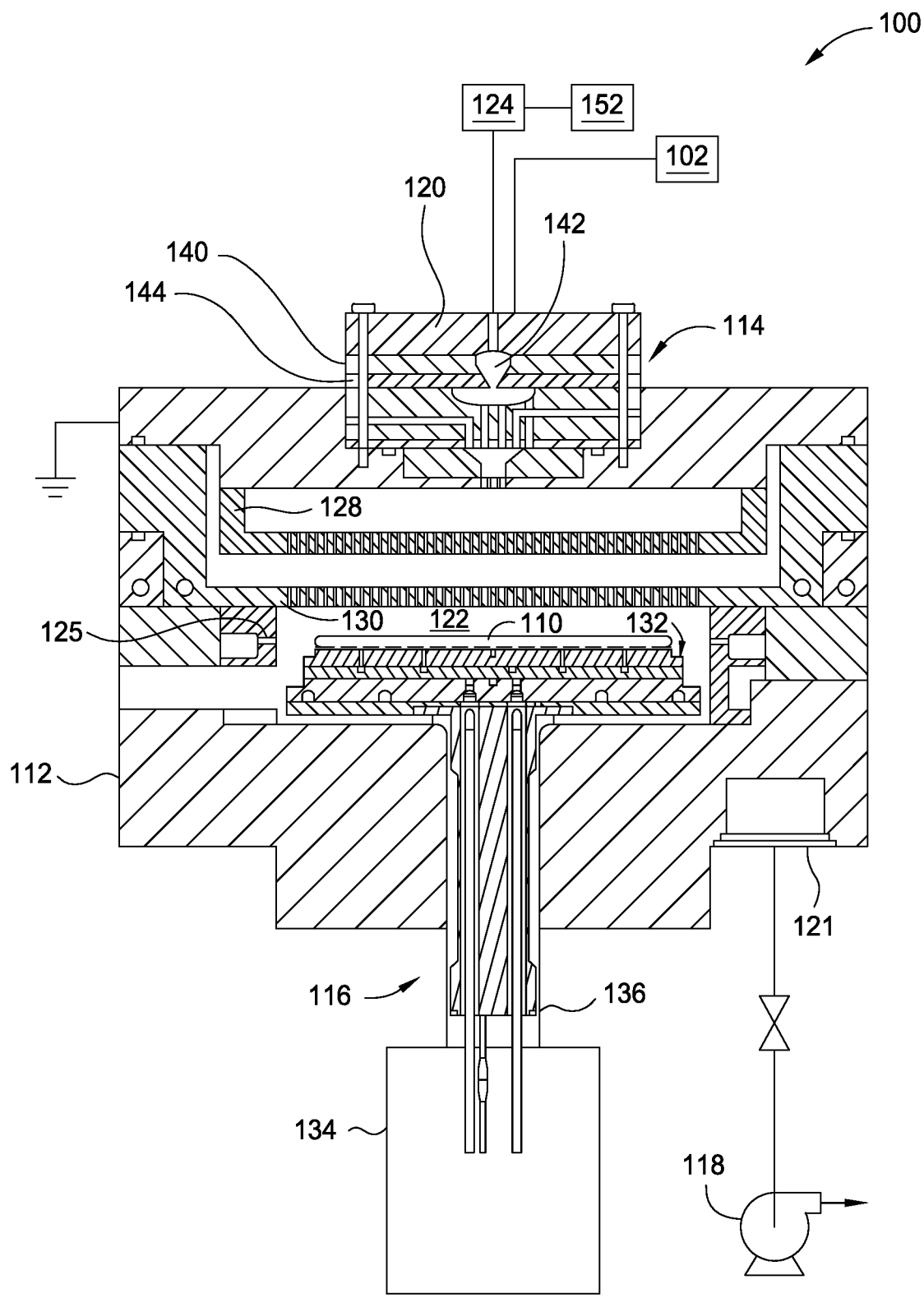
FIG. 1 is a cross-sectional view of a precleaning chamber in accordance with one implementation of the present disclosure.

To facilitate understanding, identical reference numerals have been used, where possible, to designate identical elements that are common to the figures. The figures are not drawn to scale and may be simplified for clarity. It is contemplated that elements and features of one implementation may be beneficially incorporated in other implementations without further recitation.

DETAILED DESCRIPTION

In semiconductor substrate processing, oxides are removed from a surface of a semiconductor substrate using a precleaning process. The cleaning process may include a plasma process performed within a precleaning chamber. The precleaning chamber includes a chamber body, a lid assembly, and a support assembly. The support assembly includes a substrate support pedestal on which a substrate rests. The substrate support pedestal and substrate may be moved vertically within a chamber body by an actuator that elevates a shaft of the substrate support pedestal. The substrate support pedestal may be elevated to a position in close proximity to the lid assembly to elevate the temperature of the substrate being processed. The substrate is then lowered away from the elevated position to promote cooling of the substrate. This heating and cooling may be repeated over several cycles.

To facilitate rapid heating and cooling of the substrate, the substrate support pedestal is fabricated essentially entirely from metal plates to enhance efficient heat transfer. The substrate support pedestal includes a substrate support plate coated on a top surface with a non-metallic material, such as a ceramic, which prevents metal contamination of the substrate. Compared to related art substrate support plates made entirely out of ceramic, the thin coating on the substrate support plate significantly reduces the time needed to heat and cool the substrate. The substrate support pedestal further includes a number of underlying metal plates having various functions that are brazed together to further enhance and promote good thermal conductivity through the pedestal.

FIG. 1 is a cross sectional view of a precleaning processing chamber 100 that is adapted to remove contaminants, such as oxides, from a surface of a substrate. Exemplary processing chambers that can be adapted to perform a reducing process include Siconi™ processing chambers, available from Applied Materials, Inc., of Santa Clara, California. Chambers from other manufacturers may also be adapted to benefit from the invention disclosed herein.

The processing chamber 100 may be particularly useful for performing a thermal or plasma-based cleaning process and/or a plasma assisted dry etch process. The processing chamber 100 includes a chamber body 112, a lid assembly 114, and a pedestal assembly 116. The lid assembly 114 is disposed at an upper end of the chamber body 112, and the pedestal assembly 116 is at least partially disposed within the chamber body 112. A vacuum system can be used to remove gases from processing chamber 100. The vacuum system includes a vacuum pump 118 coupled to a vacuum port 121 disposed in the chamber body 112. The processing chamber 100 also includes a controller 102 for controlling processes within the processing chamber 100.

The lid assembly 114 includes a plurality of stacked components configured to provide precursor gases and/or a plasma to a processing region 122 within the chamber 100. A first plate 120 is coupled to a second plate 140. A third plate 144 is coupled to the second plate 140. The lid assembly 114 may be connected to a remote plasma source 124 to generate plasma-byproducts that then pass through the remainder of the lid assembly 114. The remote plasma source 124 is coupled to a gas source 152 (or the gas source 152 is coupled directly to the lid assembly 114 in the absence of the remote plasma source 124). The gas source 152 may include helium, argon, or other inert gas that is energized into a plasma that is provided to the lid assembly 114. In alternate embodiments, the gas source 152 may include process gases to be activated for reaction with a substrate in the processing chamber 100.

The pedestal assembly 116 includes a substrate support pedestal 132 to support a substrate 110 thereon during processing. The substrate support pedestal 132 is coupled to an actuator 134 by a shaft 136 which extends through a centrally-located opening formed in a bottom of the chamber body 112. The actuator 134 may be flexibly sealed to the chamber body 112 by bellows (not shown) that prevent vacuum leakage around the shaft 136. The actuator 134 allows the substrate support pedestal 132 to be moved vertically within the chamber body 112 between one or more processing positions, and a release or transfer position. The transfer position is slightly below the opening of a slit valve formed in a sidewall of the chamber body 112 to allow the substrate 110 to be robotically transfer into and out of the processing chamber 100.

In some process operations, the substrate 110 may be spaced from a top surface by lift pins to perform additional thermal processing operations, such as performing an annealing step. The substrate 110 may be lowered to place the substrate 110 directly in contact with the substrate support pedestal 132 to promote cooling of the substrate 110.

Figure 2:
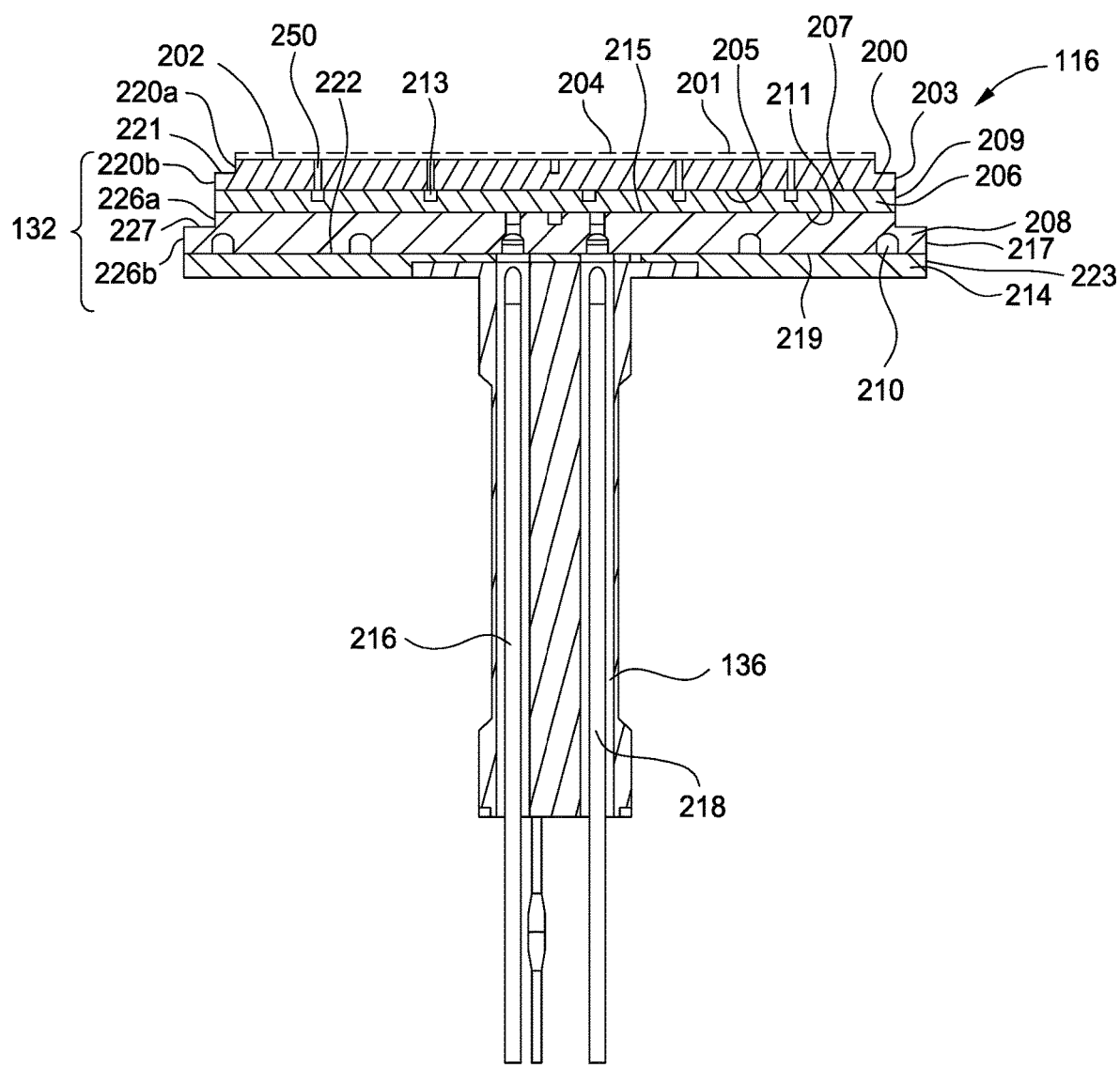
FIG. 2 is a cross-sectional view of a substrate support pedestal according to one embodiment.

FIG. 2 is a cross-sectional detail view of the substrate support pedestal 132. The substrate support pedestal 132 includes a substrate support plate 200, a gas distribution plate 206, a base plate 208 and a cap plate 214. Although the substrate support plate 200, the gas distribution plate 206, the base plate 208 and the cap plate 214 are described below as separate individual plates, it is it is contemplated that any one or more of the plates 200, 206, 208, 214 may be fabricated as a single unitary component, for example by lost foam casting or 3D printing.

The substrate support plate 200 includes a top surface 202 for supporting thereon the substrate 110 during processing, a side surface 203, and a bottom surface 205. The substrate support plate 200 has a thickness a between 0.1 inches to 0.75 inches. The substrate support plate 200 is generally fabricated from a material having good thermally conductivity, such as a metal, e.g., aluminum.

The substrate support plate 200 may include a first sub-plate 220a of a first diameter and a second sub-plate 220b of a second diameter larger than the first diameter to form a lip 221 about a periphery of the second sub-plate 220b. The sub-plates 220a, 220b may be brazed together to ensure good heat transfer. Alternatively, the substrate support plate 200 may have a unitary construction. The first diameter is substantially the same or slightly less than a diameter of the substrate 110. The second diameter is larger than the first diameter, and may optionally be sufficient to support a processing ring (not show) circumscribing the substrate 110.

The top surface 202 of the substrate support plate 200 defines the substrate-supporting surface of the pedestal 132. The top surface 202 is covered with a ceramic coating 204 to prevent metal contamination of the substrate 110. Suitable ceramic coatings include aluminum oxide, aluminum nitride, silica, silicon, yttria, YAG, or other non-metallic coating materials. The coating 204 has a thickness in the range of 50 microns to 1000 microns. The substrate 110 is configured to be vacuum chucked against the coating 204 disposed on the top surface 202 during processing. The ceramic coating 204 is not present on the side surface 203 and the lip 221.

The substrate support plate 200 includes a plurality of vacuum passages 250. The vacuum passages 250 extend through the substrate support plate 200 exiting on the top and bottom surfaces 202, 205. Vacuum is applied through the vacuum passages 250 to secure the substrate 110 to the top surface 202. It is contemplated that the vacuum passages 250 maybe routed differently through the substrate support plate 200 and provide the same functionality. The vacuum passages 250 may also be connected to a gas source, such as Ar, He, or N2 to provide backside purge behind the substrate 110, keeping process gases away from the back of the substrate 110, or to provide a backside gas to increase thermal conduction between the pedestal 132 and the substrate 110.

The gas distribution plate 206 is disposed below the substrate support plate 200. The gas distribution plate 206 has a top surface 207, a side surface 209, and a bottom surface 211. The top surface 207 of the gas distribution plate 206 is mechanically coupled to the bottom surface 205 of the substrate support plate 200. The gas distribution plate 206 is made of a thermally conductive material, e.g., a metal such as aluminum.

To further promote heat transfer between the adjoining plates 200, 206, the top surface 207 of the gas distribution plate 206 is brazed to the bottom surface 205 of the substrate support plate 200. The ceramic coating 204 is not present on the side surface 209 to promote further thermal response of the pedestal 132. The gas distribution plate 206 has a thickness in the range of 0.1 inch to 0.75 inch. The gas distribution plate 206 further includes a plurality of gas passages 213 that are aligned with the vacuum passages 250 of the substrate support plate 200 so that vacuum applied to the passages 213 is effectively provided to the top surface 202. The vacuum passages 250 are coupled to vacuum lines (not shown) that are routed through the shaft 136. In an example, the gas distribution plate 206 may be divided into multiple zones to provide different purge flows or vacuum set points to different areas of the substrate support pedestal 132.

The base plate 208 is disposed below the gas distribution plate 206, and sandwiches the gas distribution plate 206 against the support plate 200. The base plate 208 has a top surface 215, a side surface 217, and a bottom surface 219. The top surface 215 of the base plate 208 is mechanically coupled to the bottom surface 211 of the gas distribution plate 206. The base plate 208 has a thickness in the range of 0.1 inches to 0.75 inches. The base plate 208 is fabricated from a thermally conductive material, e.g., a metal such as aluminum. To further promote heat transfer between adjoining plates 206, 208, the top surface 215 of the base plate 208 is brazed to the bottom surface 211 of the gas distribution plate 206.

The base plate 208 may include a first sub-plate 226a of a first diameter and a second sub-plate 226b of a second diameter larger than the first diameter to form a lip 227 about a periphery of the second sub-plate 226b. The ceramic coating 204 is not present on the side surface 217 or the lip 227 to promote good heat transfer of the pedestal with the surrounding environment.

A diameter of the gas distribution plate 206 may be equal to a diameter of the second sub-plate 220a to align the outer perimeter of the gas distribution plate 206 with the substrate support plate 200. A diameter of the gas distribution plate 206 may be equal to a diameter of the first sub-plate 226a to align the outer perimeter of the gas distribution plate 206 with the base plate 208. The base plate 208 has a plurality of cooling channels 210 formed therein for receiving a coolant fluid for cooling the substrate 110 through cooling channels 210. The coolant fluid may for through the channels 210 in direct contact with material of the base plate 208, or through a conduit disposed in the channels 210.

The substrate support pedestal 132 further includes a cap plate 214 mechanically couple to and underlying the base plate 208 for sealing the channels 210 within the base plate 208. The cap plate 214 has a top surface 222 and a side surface 223. The cap plate 214 has a thickness in the range of 0.1 inches to 0.75 inches. The cap plate 214 may be fabricated from a thermally conductive material, such as a metal, e.g., aluminum. A diameter of the cap plate 214 may be equal to a diameter of the second sub-plate 226a to align the outer perimeter of the base plate 208 with the cap plate 214. To further promote a heat transfer between the adjoining plates 208, 214, the top surface 222 of the cap plate 214 is brazed to the bottom surface 219 of the base plate 208. The ceramic coating 204 is not present on the side surface 223 to promote good heat transfer of the pedestal with the surrounding environment A fluid supply conduit 216 and a fluid return conduit 218 disposed through the shaft 136. The fluid supply conduit 216 is coupled to an inlet port (not shown) of the channels 210 formed in thermal base plate 208, while the fluid return conduit 218 is coupled to an outlet port (not shown) of the channels 210 formed in the base plate 208. The fluid provided through the conduits 216, 218 is circulating through the cooling channels 212 of the base plate 208 to provide efficient temperature control of the pedestal 132.

Figure 3:
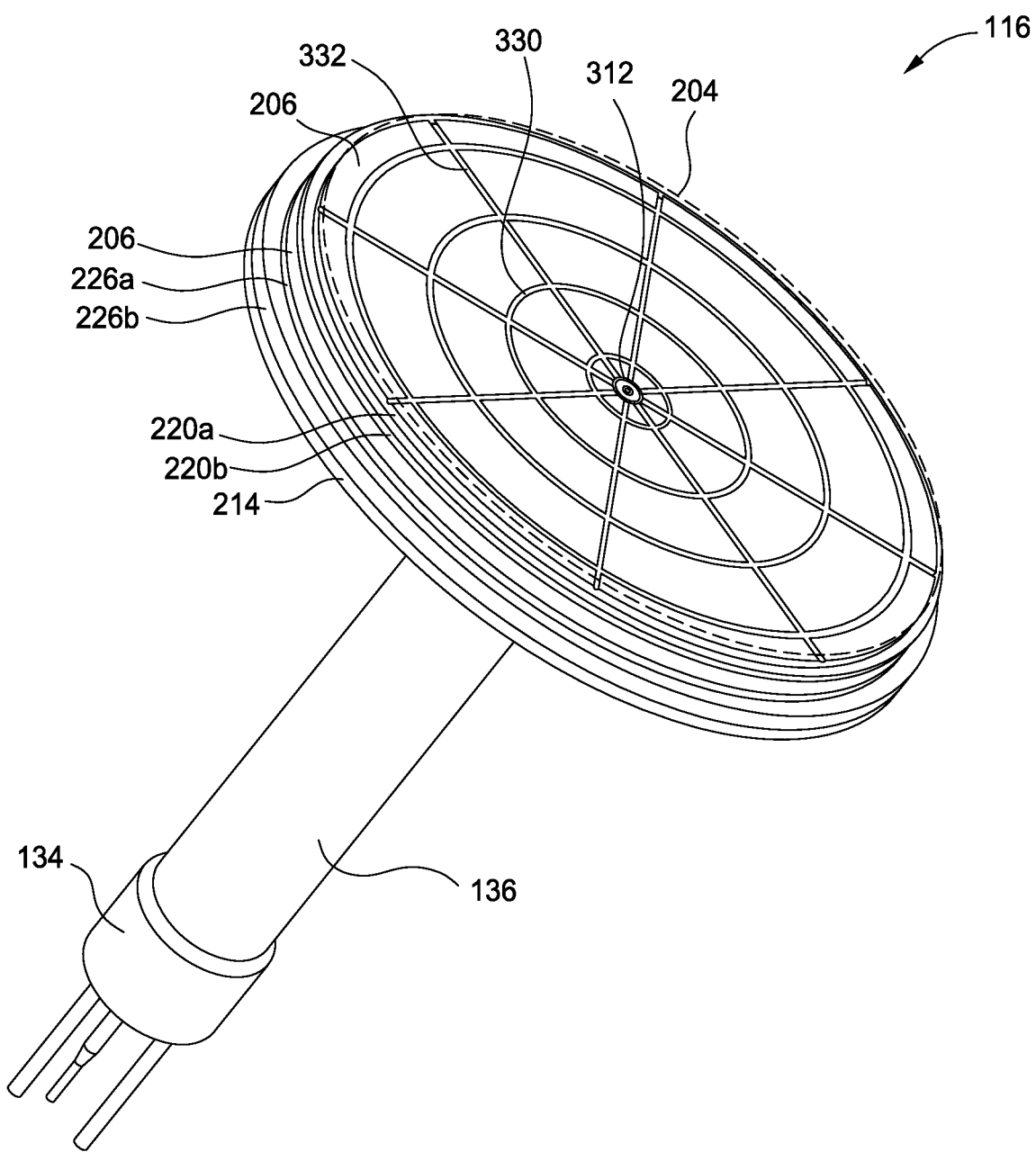
FIG. 3 is a perspective view of the substrate support pedestal of FIG. 2.

FIG. 3 is a perspective view of the substrate support pedestal 132 of FIG. 2. As noted above, the top surface 202 of the substrate support plate 200 is covered with a ceramic coating 204 to prevent metal contamination of the substrate 110. The top surface 202 of the substrate support pedestal 132 generally has a plurality of concentric gas distribution channels 330 interconnected with radial distribution channels 332 for receiving purge gas from the gas distribution plate 206 through passages 250 in the gas distribution plate 206 (as shown in FIG. 2). The ceramic coating 204 covers the plurality of concentric gas distribution channels 330 and the radial distribution channels 332.

Figure 4:
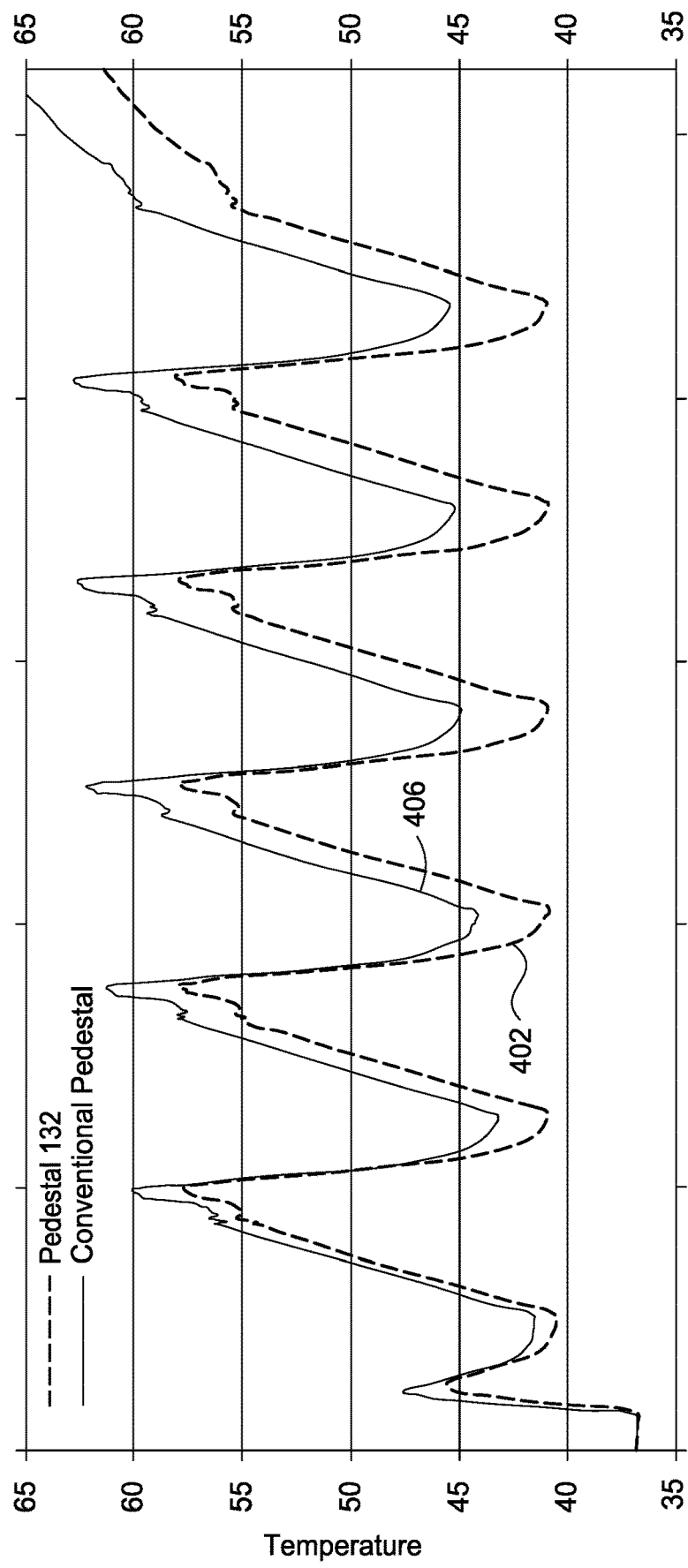
FIG. 4 is a plot of time versus temperature of a substrate undergoing temperature cycling in a chamber that employs a conventional substrate support pedestal and a plot of temperature of a substrate undergoing temperature cycling in a chamber that employs the substrate support pedestal of FIGS. 2 and 3.

FIG. 4 is a plot 402 of time versus temperature of the substrate 110 disposed in a processing chamber that employs a convention cooling pedestal to a plot 406 of temperature of the substrate 110 for a processing chamber, such as the chamber 100, that employs the substrate support pedestal 132 of FIGS. 2 and 3. As shown in FIG. 4, the plot 402 has relatively consistent temperature peaks of about 58 degrees C. and lower troughs of about 42 degrees C. Further, there is noticeable upward drift in temperature observed for the plot 406 versus the plot 402. The plot 406 has peaks that begin at about 60 degrees C. (significantly hotter than the peaks of the plot 402) and drift upward over several cycles to about 63 degrees C., illustrating very robust and repeatable temperature control with the substrate support pedestal 132 relative to the conventional pedestal. The substrate support pedestal 132 therefore heats and cools more reliably than a conventional pedestal.

While the foregoing is directed to implementations of the present disclosure, other and further implementations of the disclosure may be devised without departing from the basic scope thereof.

What is claimed is:

1. A substrate support pedestal assembly suitable for use in semiconductor manufacturing, comprising:
   a shaft;
   a substrate support pedestal coupled to the shaft, the substrate support pedestal comprising an aluminum substrate support plate having a top surface and a bottom surface, an inner periphery, and an outer periphery circumscribing the inner periphery, the aluminum substrate support plate further comprising:
      vertical passages extending from the bottom surface to the top surface of the aluminum substrate support plate, and wherein the top surface is coated with a ceramic material, the vertical passages comprising vacuum passages;
   a gas distribution plate in contact with the bottom surface of the aluminum substrate support plate, the gas distribution plate comprising a plurality of gas passages aligned with the vacuum passages;
   a lip extending outward below the top surface, the lip extending between the outer periphery and the inner periphery, wherein the ceramic material extends to the inner periphery and solely coats the top surface, such that the lip is exposed and sides of the aluminum substrate support plate are exposed and uncoated by the ceramic material;

a plurality of concentric gas distribution channels configured to receive gas through the vertical passages from the gas distribution plate; and a plurality of radial distribution channels coupled to the plurality of concentric gas distribution channels, wherein the ceramic material is disposed over the plurality of concentric gas distribution channels and the plurality of radial distribution channels.

2. The substrate support pedestal assembly of claim 1, wherein the ceramic material is aluminum oxide.

3. The substrate support pedestal assembly of claim 1, wherein the plurality of radial distribution channels extend from an inner concentric channel of the plurality of concentric gas distribution channels to an outer concentric channel of the plurality of concentric gas distribution channels.

4. The substrate support pedestal assembly of claim 1, wherein the gas distribution plate is divided into multiple zones to provide different purge flows or vacuum set points to different areas of the substrate support pedestal.

5. The substrate support pedestal assembly of claim 1, wherein the top surface of the substrate support pedestal has the plurality of concentric gas distribution channels interconnected with the plurality of radial distribution channels for receiving purge gas from the gas distribution plate through the plurality of gas passages in the gas distribution plate.

6. The substrate support pedestal assembly of claim 5, wherein the ceramic material covers the plurality of concentric gas distribution channels and the radial distribution channels.

7. The substrate support pedestal assembly of claim 1, wherein the substrate support pedestal further comprises:
a base plate brazed to a bottom of the gas distribution plate, the base plate having a plurality of cooling channels formed therein for receiving a coolant fluid routed through the shaft.

8. The substrate support pedestal assembly of claim 7, wherein the gas distribution plate and the base plate are fabricated from aluminum.

9. The substrate support pedestal assembly of claim 7, wherein the substrate support pedestal further comprises:
a cap plate coupled to the base plate and sealing the cooling channels formed in the base plate.

10. A processing chamber suitable for use in semiconductor manufacturing, comprising:
a chamber body; and
a pedestal assembly at least partially disposed within a processing region of the chamber body, wherein the pedestal assembly includes a substrate support pedestal to support a substrate thereon during processing, the substrate support pedestal comprising:
a shaft; and
an aluminum substrate support plate having a top surface and a bottom surface, an inner periphery, and an outer periphery circumscribing the inner periphery, the aluminum substrate support plate mechanically coupled to the shaft and comprising:
vertical passages extending from the bottom surface to the top surface of the aluminum substrate support plate, and wherein the top surface is coated with a ceramic material, the vertical passages comprising vacuum passages; and a gas distribution plate in contact with the bottom surface of the aluminum substrate support plate, the gas distribution plate comprising a plurality of gas passages aligned with the vacuum passages;

a lip extending outward below the top surface, the lip extending between the outer periphery and the inner periphery, wherein the ceramic material extends to the inner periphery and solely coats the top surface, such that the lip is exposed and sides of the aluminum substrate support plate are exposed and uncoated by the ceramic material;

a plurality of concentric gas distribution channels configured to receive gas through the vertical passages from the gas distribution plate; and a plurality of radial distribution channels coupled to the plurality of concentric gas distribution channels, wherein the ceramic material is disposed over the plurality of concentric gas distribution channels and the plurality of radial distribution channels.

11. The processing chamber of claim 10, wherein the ceramic material is aluminum oxide.

12. The processing chamber of claim 10, wherein the plurality of radial distribution channels extend from an inner concentric channel of the plurality of concentric gas distribution channels to an outer concentric channel of the plurality of concentric gas distribution channels.

13. The processing chamber of claim 10, wherein the gas distribution plate is divided into multiple zones to provide different purge flows or vacuum set points to different areas of the substrate support pedestal.

14. The processing chamber of claim 10, wherein the top surface of the substrate support pedestal has the plurality of concentric gas distribution channels interconnected with the plurality of radial distribution channels for receiving purge gas from the gas distribution plate through the plurality of gas passages in the gas distribution plate.

15. The processing chamber of claim 14, wherein the ceramic material covers the plurality of concentric gas distribution channels and the radial distribution channels.

16. The processing chamber of claim 10, wherein the substrate support pedestal further comprises:
a base plate brazed to a bottom of the gas distribution plate, the base plate having a plurality of cooling channels formed therein for receiving a coolant fluid routed through the shaft.

17. The processing chamber of claim 16, wherein the gas distribution plate and the base plate are fabricated from aluminum.

18. The processing chamber of claim 16, wherein the substrate support pedestal further comprises:
a cap plate coupled to the base plate and sealing the cooling channels formed in the base plate.

19. The substrate support pedestal assembly of claim 1, wherein the ceramic material has a thickness of 50 microns to 1000 microns.

20. The processing chamber of claim 10, wherein the ceramic material has a thickness of 50 microns to 1000 microns.

* * * * *